United States Patent Office 3,782,938

Patented Jan. 1, 1974

3,782,938

PHOTOSENSITIVE ELEMENT COMPRISING POLYMERS WITH CYCLOPROPENYL GROUPS AND PROCESS

Charles D. De Boer, Rochester, N.Y., assignor to Eastman Kodak Company, Rochester, N.Y.

No Drawing. Continuation-in-part of abandoned applications Ser. No. 831,242, June 6, 1969, and Ser. No. 168,342, Aug. 2, 1971. This application Nov. 30, 1971, Ser. No. 203,427

Int. Cl. G03c *1/68, 1/70*

U.S. Cl. 96—35.1 12 Claims

ABSTRACT OF THE DISCLOSURE

There is described a novel class of light-sensitive polymers and the use of these polymers in photosensitive composition elements and processes. The polymers have appended to a polymer backbone a light-sensitive unsaturated cyclic group which is a three to six membered carbocyclic or monocyclic heterocyclic ring containing an ethylenic double bond or a five to six membered ethylenically unsaturated carbocyclic or heterocyclic ring free of exocyclic double bonds and fused to an aromatic ring of the benzene series.

This application is a continuation-in-part of my copending U.S. application Ser. No. 831,242 filed June 6, 1969, and Ser. No. 168,342 filed Aug. 2, 1971, both of which are now abandoned.

This invention relates to photographic reproduction. In a particular aspect it relates to light-sensitive polymers which are useful in reproducing images by exposure to actinic radiation and to photosensitive compositions and elements containing these polymers.

It is known in the photographic art to reproduce images by processes which involve as essential features imagewise exposure of a coating of a radiation-sensitive material, the solubility of which is differentially modified by the action of radiation, and subsequent treatment of the coating with a solvent or solvent system which preferentially removes portions of the coating in accordance with its exposure to light. Such processes have been employed to prepare lithographic printing plates, stencils, photoresists, and the like. Among the radiation-sensitive materials which have been used in such processes are light-sensitive polymers which are insolubilized or hardened on photoexposure.

The different applications in which light-sensitive polymers are used requires that such polymers be available with a variety of photographic and physical characteristics. Thus, there is a continual search for novel light-sensitive polymers which improve upon and differ from existing light-sensitive polymers. Because many of the existing light-sensitive polymers are relatively slow in photographic speed when compared with silver halide and similar materials, light-sensitive polymers with high photographic speed are desired. Light-sensitive polymers which are sensitive, or which can be sensitized, to the visible region of the spectrum are desired by those employed in the photographic arts. Similarly, light-sensitive polymers are desired which have good stability under handling and storage conditions.

Accordingly, there is a need for novel light-sensitive polymers which have high photographic speed, which make efficient use of the exposing radiation, which are sensitive or can be sensitized to the visible region of the spectrum and which can be stored for long periods of time under a variety of conditions without adversely affecting their photosensitive properties.

It is an object of this invention to provide a novel class of light-sensitive polymers.

It is a further object of this invention to provide novel light-sensitive polymers which make efficient use of the incident radiation in insolubilizing the polymer.

It is still a further object of this invention to provide novel light-sensitive polymers which are relatively stable under storage and handling conditions.

It is another object of this invention to provide photosensitive compositions and elements containing these novel light-sensitive polymers.

It is yet another object of this invention to provide processes for the reproduction of images employing these novel light-sensitive polymers.

The above and other objects of this invention will become apparent to those skilled in the art from the further description of the invention which follows.

In accordance with the present invention there is provided a novel class of light-sensitive polymers and novel photosensitive compositions and elements containing them. The polymers of the present invention have appended to the polymer backbone as the light-sensitive moiety an unsaturated cyclic group which is a three to six membered carbocyclic or monocyclic heterocyclic ring containing an ethylenic double bond, or is a five to six membered ethylenically unsaturated carbocyclic or heterocyclic ring free of exocyclic double bonds and fused to an aromatic ring of the benzene series. The heterocyclic ring can contain such non-metallic hetero atoms as oxygen, sulfur, nitrogen and the like. The light-sensitive polymers can be prepared by condensing a derivative of the unsaturated cyclic group with a preformed polymer backbone containing groups reactive therewith. Thus, the unsaturated cyclic group is joined to the polymer backbone through a linking group which is the condensation product of a group on the unsaturated cyclic ring with a group on the polymer backbone which is reactive therewith.

Although light-sensitive polymers are known which contain carbon to carbon unsaturation and which utilize this unsaturation in a radiation induced insolubilization reaction, in almost all of these polymers of which I am aware, the unsaturation which contributes to the insolubilization of the polymer is contained in a linear chain rather than in a cyclic group. It has been found that polymers which contain the carbon to carbon double bond in a cyclic group make more efficient use of the incident radiation, are more stable under storage conditions, and can be more highly sensitized than polymers prepared from corresponding compounds in which the double bond is not contained in a cyclic group.

The unsaturated groups which form the light sensitive moiety in the light sensitive polymers of this invention include derivatives of such unsaturated three to six membered carbocyclic compounds as aryl and diarylcyclopropenes, alkyl and dialkylcyclopropenes, aryl and diarylcyclobutenes, alkyl and dialkylcyclobutenes, aryl and diarylcyclopentenes, alkyl and dialkylcyclopentenes, aryl and diarylcyclohexenes, alkyl and dialkylcyclohexenes, etc.; such unsaturated monocyclic heterocyclic rings as furans, pyrroles, thiophenes and the like; and such unsaturated five to six membered carbocyclic or heterocyclic compounds containing a fused aromatic ring as benzofurans, benzothiofurans, benzopyrans, indoles, indenes and the like.

Derivatives of the light sensitive moiety which are reactive with preformed polymer backbones include carboxylic acids and acid halides e.g. carbonyl chlorides; oxycarboxylic acid halides; alcohols and thiols, e.g., carbinols, thiocarbinols; alkyl halides, e.g. methyl bromide; alkyl tosylates, e.g. methyl tosylate; isocyanates; ketenes; aldehydes; ketones and the like.

A variety of preformed polymers can be employed in the preparation of the light sensitive polymers of this invention. Such polymers should contain groups which are reactive with a derivative of the light sensitive polymer, should not contain any groups which would interfere with the condensation reaction between the derivative of the light sensitive moiety and the groups on the polymer which are reactive therewith, should not contain any groups which would crosslink under the conditions of the condensation reaction and render the polymer insoluble, and should not contain any groups which would react with the ethylenic double bond contained in the light sensitive moiety (and hence destroy, or severely reduce the light sensitivity of the resultant polymer). Representative of suitable polymers, which are reactive with one or more of the derivatives named above are those containing such groups as free hydroxyl groups, e.g., polyvinyl alcohol, the polyether condensation product of epichlorohydrin and 2,2-bis-(4-hydroxyphenyl)propane; free thiol groups, e.g., polyvinyl mercaptan, polythiolstyrene; reactive amino groups, e.g., polyvinyl anthranilate, polyaminostyrene; carboxylic acid anhydrides, e.g. copolymers of maleic anhydride with ethylene or styrene; halogen groups, e.g., polyvinyl chloride, chloromethylated polystyrene; sulfonyl chloride groups, e.g. polyvinyl sulfonyl chloride; active methylene groups, e.g. poly(ethyl-2-vinylcarbonyl acetate); and the like.

The condensation of derivatives of the light-sensitive moiety with preformed polymers such as those named above will result in the light sensitive moiety being attached to the polymer backbone through such linking groups as ester groups, e.g. oxycarbonyl, carbonyloxy, amido, carbonate, sulfonate; urethane groups (carbamate); ether groups; carbon to carbon double bonds; and the like.

Light-sensitive polymers of the present invention have repeating units which can be depicted by one of the following structural formulae:

(I)

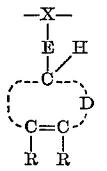

(II)

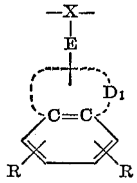

wherein X represents a polymer backbone; E is a linking group containing such moieties as ester groups, e.g. oxycarbonyl, carbonyloxy, thiocarbonyl, carbonylthio, amido, carbonate, sulfonate, thiosulfonate, etc.; urethane groups; ether groups; thioether groups; amino groups; carbon to carbon double bonds; and the like; D represents the nonmetallic atoms necessary to complete a three to six membered carbocyclic or monocyclic heterocyclic ring, preferably D represents the atom necessary to complete a carbocyclic ring such as a cyclopropene ring, a cyclobutene ring, a cyclopentene ring or a cyclohexene ring; $D_1$ represents the non-metallic atoms necessary to complete a five to six membered ethylenically unsaturated carbocyclic or heterocyclic ring free of exocyclic double bonds, such as a furan ring, a thiofuran ring, a pyrrole ring, a pyran ring, a cyclopentene ring, etc., and each R is a hydrogen atom, an alkyl group of 1 to 12 carbon atoms (e.g., methyl, ethyl, propyl, butyl, amyl, hexyl, nonyl, decyl, dodecyl, etc.), or an aryl group having one or two rings, such as a phenyl or a naphthyl group which is unsubstituted or substituted with one or more of such groups as hydroxy groups, halogen groups (e.g., chloro and bromo groups), carbonyl groups, cyano groups, alkyl groups of 1 to 12 carbon atoms, alkoxy groups of 1 to 12 carbon atoms, and the like.

A preferred group of light-sensitive polymers of the present invention are those which are obtained by esterifying a hydroxyl containing polymer with a 1,2-diarylcyclopropene-3-carbonyl chloride and which contain repeating units represented by the following structural formula:

(III)

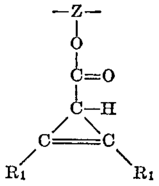

wherein Z represents the polymeric residue of a hydroxyl containing polymer; and each $R_1$ is an aryl group such as a phenyl group, a substituted phenyl group, a naphthyl group, a substituted naphthyl group, etc.

In addition to the light-sensitive group, the polymers of this invention can contain other non-light-sensitive groups attached to the polymer backbone. Such other groups are often useful in modifying such physical properties of the polymer as solubility, adhesivity, melting point, and the like. These groups can comprise up to 90 mole percent of the groups attached to the polymer backbone. Thus, useful light-sensitive polymers of the present invention can contain as little as 10 mole percent of the light-sensitive group attached to the polymer backbone and preferably contain about from 10 to 85 mole percent of the light-sensitive group. Depending upon the preformed polymer employed, useful groups include those derived from aliphatic and aromatic carboxylic acids, such as acetic acid, haloacetic acids, propionic acid, succinic acid, glutaric acid, adipic acid, sebacic acid, decanoic acid, benzoic acid, halobenzoic acids, nitrobenzoic acids, toluic acids, p-ethylbenzoic acid, p-octylbenzoic acid, p-ethoxybenzoic acid, p-amyloxybenzoic acid, 2-naphthoic acid etc.; aliphatic and aromatic alcohols and thiols, such as the alcohol and thiol analogs of the carboxylic acids named above; and other compounds containing functional groups which are reactive with groups on the preformed polymer.

These additional modifying groups can be represented by repeating units having the structural formula:

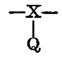

and in particular by the structural formula:

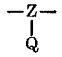

wherein X and Z are as defined above and Q represents the residue of a modifying compound, such as an aliphatic or aromatic carboxylic acid, or an aliphatic or aromatic alcohol or thiol when reacted with a group on the preformed polymer.

The light sensitive polymers of the present invention typically have inherent viscosities of 0.25 or higher. As would be expected, the inherent viscosity of a particular polymer of this invention will depend upon the preformed polymer employed to prepare the light sensitive polymer, the degree of substitution of that polymer with light sensitive moieties and modifying moieties, the particular light sensitive moieties and modifying moieties employed and similar factors. For use in photosensitive compositions and elements, it is preferred that the polymers of this invention have an inherent viscosity in the range of 0.5 to 3.0.

The light sensitive polymers of this invention can be prepared by condensation techniques well known to those skilled in the art. Typically, a derivative of the light sensitive moiety is added to a solution of the preformed polymer in the presence of such materials as catalysts, acid acceptors, and the like, if required, and after heating, if required, the light sensitive polymer is precipitated from the reaction mixture by the addition of a non-solvent for the polymer, and collected.

A highly useful procedure for preparing the light-sensitive polymers of this invention which are the condensation product of a polymer containing a free hydroxyl group with a carboxylic acid chloride of an appropriate light-sensitive unsaturated cyclic compound to yield light-sensitive polymers which have good solubility and other desirable physical properties is described in copending Reynolds U.S. Pat. 3,560,465, issued Feb. 2, 1971. This procedure involves swelling a hydroxyl containing polymer in pyridine followed by partial esterification with an aroyl chloride such as benzoyl chloride. The light-sensitive acid chloride is then reacted with the mixture and finally the esterification of any remaining hydroxyl groups is completed with benzoyl chloride. Acetone or dimethylformamide is then added, insoluble materials are filtered off and the polymer is precipitated by drawing the solution through a water aspirator. The polymer is then leached in running water and air dried.

Derivatives of unsaturated cyclic groups which can be used to prepare polymers of this invention can be prepared by procedures known to those skilled in the art. For example, 1,2-diphenylcyclopropene-3-carboxylic acid can be prepared by the procedure of Breslow et al., J. Org. Chem., vol. 24 (1959), p. 415, which involves the dropwise addition of ethyldiazoacetate to a stirred melt of diphenylacetylene at 130° C. containing 1–2% copper dust, followed by basic hydrolysis of the reaction mixture, extraction of the unreacted diphenylacetylene with cyclohexane and acidification to precipitate the product. Similarly, 5,6-benzopyran-3-carboxylic acid can be prepared by the procedure of Taylor et al., J. Chem. Soc. (1950), p. 2724, which involves slowly adding a solution of sodium hydroxide to a refluxing mixture of salicylaldehyde, acrylonitrile and water, cooling the mixture to precipitate the nitrile which is then hydrolyzed with refluxing sodium hydroxide to give the carboxylic acid. The light sensitive carbonyl chlorides can be prepared by reacting the corresponding carboxylic acid with a halogenating agent such as thionyl chloride or oxalyl chloride.

1,2-diphenyl cyclopropenyl-3-carbinol can be prepared by the procedure of Breslow et al., J. Am. Chem. Soc., vol. 84 (1962), pp. 2797 and 2798, which involves reduction of a solution of 1,2-diphenyl cyclopropene-3-carbonyl chloride in ice cold diglyme with tri-t-butoxyaluminohydride and precipitation of the product with water.

Polymers prepared in accordance with the present invention find utility in various photographic applications, such in the preparation of photomechanical images such as lithographic printing plates, photoresists, and the like.

Coating compositions containing the light-sensitive polymers of this invention can be prepared by dispersing or dissolving the polymer in a suitable organic solvent such as aromatic solvents, for example, benzene, xylene, toluene, benzyl alcohol, etc.; alkanols, such as ethanol, isopropanol, 2-methoxyethanol, etc.; ketones such as acetone, 2-butanone, 4-methyl-2-pentanone, cyclohexanone, etc.; chlorinated hydrocarbon solvents such as chloroform, carbon tetrachloride, trichloroethylene, dichloroethane, trichloroethane, tetrachloroethane, etc.; dimethyl formamide; mixtures of these solvents, and the like. Coating compositions can include a variety of photographic addenda utilized for their known purpose, such as agents to modify the flexibility of the coating, agents to modify its surface characteristics, dyes and pigments to impart color to the coating, agents to modify the adhesivity of the coating to the support, and a variety of other addenda known to those skilled in the art.

The coating compositions can be sensitized with such materials as pyrylium and thiapyrylium salts, thiazoles, benzothiazolines, naphthothiazolines, quinolizone, Michler's ketone, Michler's thioketone, benzophenone, furanones, anthraquinones, 2,6 - bis-p-azidobenzal-4-methylcyclohexanone and the like sensitizers. Because of the wide range of spectral response and high photographic speed of the light-sensitive polymers of the present invention, often it is not necessary to incorporate sensitizers in the photosensitive coating composition. When a sensitizer is employed, it can be present in the composition in amounts of about 0.005 to 5 percent by weight.

The light-sensitive polymer of this invention can be the sole polymeric constituent of the coating composition or another polymer can be incorporated therein to modify the physical properties of the composition and serve as a diluent. For example, phenolic resins such as thermoplastic novolac resins can be incorporated in the composition to improve the resistance of the polymer composition to etchants when it is used as a photoresist. Similarly, hydrophilic polymers such as cellulose and its derivatives, polyalkylene oxides, polyvinyl alcohol and its derivatives, etc., can be incorporated in the composition to improve the hydrophilic properties of the coating when it is used in the preparation of lithographic printing plates. These other polymeric materials can constitute up to 25% by weight, based on the weight of the light-sensitive polymer, of the coating composition.

Photosensitive elements can be prepared by coating the photosensitive compositions for solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as polyalkyl methacrylates [e.g., poly(methylmethacrylate)], polyester film base [e.g., poly(ethylene terephthalate)], polyvinyl acetals, polyamides (e.g., nylon), cellulose ester film base (e.g., cellulose nitrate, cellulose acetate, cellulose acetate propionate, cellulose acetate butyrate), and the like. The optimum coating thickness for a particular purpose will depend upon such factors as the use to which the coating will be put, the particular light-sensitive polymer employed, and the nature of other components which may be present in the coating. Typical coating thicknesses can be from about 0.1 to 10 mils.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked polymer which is a non-solvent for the exposed hardened polymer. Such solvents can be selected from the solvents listed above as suitable coating solvents as well as others.

The following examples further illustrate the present invention.

EXAMPLE 1

1.3 g. of a medium molecular weight polyvinyl alcohol containing 12% acetate groups (Elvanol 52–22 sold by E. I. du Pont Company) is swollen in 20 ml. of dry pyridine at 90° C. for one hour. Then 0.5 ml. of benzoyl chloride is added with stirring, and the mixture is stirred for one hour. Under safelight conditions 1.0 g. of 1,2-diphenylcyclopropene-3-carboxylic acid chloride is added with stirring and the mixture is stirred in the dark for one hour. (In this and subsequent examples, once the light-sensitive moiety is added all operations are performed under safelight conditions or in the dark.) At the end of this time the solution is homogeneous, clear, transparent and viscous. Then 0.8 ml. of benzoyl chloride is added, the mixture is stirred for one hour and then held at 50° C.

for one hour without stirring. After this, 15 ml. of acetonitrile is added and the polymer is precipitated into 1500 ml. of water with stirring. The polymer is collected and pressed dry. It is then dried in a vacuum oven at 60° C. and $10^{-1}$ torr pressure for one hour. The polymer is dissolved in 100 ml. of acetone, precipitated into one liter of water, collected and dried in a vacuum oven for 12 hours at 50° C. and a pressure of 11 torr. The product obtained is a white, friable, light-sensitive polymer containing 26 mole percent 1,2-diphenylcyclopropene-3-carboxylate groups.

EXAMPLE 2

Coating solutions of the polymer of Example 1 are prepared and various sensitizers are added. These solutions are whirl coated on lithographic supports, dried and evaluated for spectral response and photographic sensitivity. The results are tabulated below. Photographic speed and spectral response is determined by the procedure of Minsk et al., Journal of Applied Polymer Science; Vol. 2, No. 6, pages 302–311 (1959). Sensitivity value is a measure of the relative speed of the polymer compared with unsensitized polyvinyl cinnamate. The sensitizers employed in this and subsequent examples are as follows:

(1) 2-benzoylmethylene-1-methyl-β-naphthothiazoline
(2) Methyl-2-(N-methylbenzothiazolylidene)dithioacetate
(3) Michler's ketone
(4) Michler's thioketone
(5) 2-methylanthraquinone
(6) 2,6-bis(p-ethoxyphenyl)-4-(p-amyloxyphenyl) thiapyrylium perchlorate
(7) 4-quinolizone
(8) Benzophenone
(9) 9-fluorenone
(10) Benzil
(11) 4-methylbenzophenone
(12) 4-thioquinolizone
(13) N-phenylacridone

| | Polymer of Example 1 | |
|---|---|---|
| Sensitizer | Sensitivity value | Range of spectral response |
| None | 45 | 270-360 |
| 1 | 4,000 | 270-460 |
| 2 | 45 | 270-440 |
| 3 | 1,400 | 270-440 |
| 5 | 56 | 270-420 |
| 6 | 79 | 270-540 |
| 7 | 56 | 270-420 |
| 8 | 45 | 270-390 |

EXAMPLE 3

1.3 g. of a high molecular weight polyvinyl alcohol containing 12% acetate groups (Elvanol 50–42, sold by E. I. du Pont Company) is swollen in 20 ml. of dry pyridine overnight with stirring at 80° C. There is then added with stirring 0.5 ml. of benzoyl chloride and the mixture is held at 50° C. for one hour and at room temperature for four hours. Then 2.0 g. of 1,2-diphenylcyclopropene-3-carboxylic acid chloride is added and the polymer goes into solution. The mixture is stirred at room temperature for four hours. After this, 0.6 ml. of benzoyl chloride is added and the solution is stirred at room temperature for four hours. The polymer is precipitated into 1600 ml. of water with stirring and allowed to remain in the water for eight hours. The polymer is then collected and dried in a vacuum oven at 35 torr pressure at 50° C. for several hours. The polymer is stirred with 100 ml. of acetone for 12 hours. Solution is incomplete, and mixture is poured into 1200 ml. of water, the polymer is collected and dried in the vacuum oven. A light-sensitive polymer containing 13 mole percent of the light-sensitive grouping is obtained having the following photosensitive characteristics:

| Sensitizer | Sensitivity value | Range of Spectral response |
|---|---|---|
| None | 500 | 270-360 |
| 1 | 14,000 | 270-470 |
| 3 | 10,000 | 270-470 |
| 9 | 2,000 | |
| 10 | 1,400 | |
| 11 | 890 | |

EXAMPLE 4

21 g. of a medium molceular weight polyvinyl alcohol used in Example 1 is swollen overnight at 50° C. in 300 ml. of dry pyridine, then 6.3 ml. of benzoyl chloride is added with stirring and the mixture is stirred at 50° C. for two hours. After this, 23 g. of 1,2-diphenylcyclopropene-3-carboxylic acid chloride is added in the dark with stirring. Then 12.6 ml. of benzoyl chloride is added and the mixture is stirred for four hours. The polymer is precipitated into eight liters of water with stirring, allowed to leach overnight and collected. The polymer is dried under vacuum at 50° C., dissolved in acetone and precipitated into water a second time, after which it is collected and dried under vacuum. A light-sensitive polymer containing 34 mole percent of the light-sensitive grouping is obtained having the following photosensitive characteristics:

| Sensitizer | Sensitivity value | Range of Spectral response |
|---|---|---|
| None | 110 | 270-360 |
| 1 | 2,300 | 270-470 |
| 3 | 2,300 | 270-440 |
| 7 | 110 | 270-420 |
| 12 | 140 | 270-480 |
| 13 | 562 | 270-430 |

EXAMPLE 5

44 g. of a medium molecular weight, completely hydrolyzed polyvinyl alcohol (Elvanol 71–30, sold by E. I. Du Pont Company) is added to 600 ml. of dry pyridine and heated at 50° C. for 12 hours. There is then added with stirring 28 g. of benzoyl chloride and the mixture is maintained at 43° C. for 3 hours. Then 90 g. of 1,2-diphenylcyclopropene-3-carboxylic acid chloride is added and the mixture is stirred at room temperature for 3 hours. Next 28 g. of benzoyl chloride is added and the mixture is stirred at room temperature for one hour. The polymer thus obtained is precipitated in water, collected and purified as described in the preceding examples. A light-sensitive polymer containing 48 mole percent of the light-sensitive grouping is obtained which has a sensitivity value of 36,000 when sensitized with 2-benzoylmethylene-1-methyl-β-naphthothiazoline.

EXAMPLE 6

3.0 g. of a medium molecular weight polyvinyl alcohol containing 12% acetate groups is swollen in 100 ml. of dry pyridine at 60° C. for three hours. Then 15 g. of 1,2-diphenylcyclopropene-3-carboxylic acid chloride is added with stirring. This mixture is stirred at room temperature for four hours. The polymer is precipitated in three liters of water, collected and purified as in the preceding examples. There is thus obtained a light-sensitive polymer containing 81 mole percent of the light-sensitive grouping which has a sensitivity value of 24,000 when sensitized with 2-benzoylmethylene-1-methyl-β-naphthothiazoline.

EXAMPLE 7

A solution is prepared of 60 g. of a poly(hydroxy ether), prepared by condensation of 2,2-bis(p-hydroxyphenyl) propane with epichlorohydrin (Phenoxy PRDA 8030 sold by Union Carbide Corp.), in 100 ml. of pyridine and 150 ml. of ethylene chloride. This quantity of polymer contains 21 mole percent of free hydroxyl groups. To this mixture is added with stirring, a solution of 60 g. (.24 mole) of 1,2-diphenylcyclopropene-3-carboxylic acid chloride in 100 ml. of warm ethylene chloride over a period of one hour, maintaining the temperature of the reaction mixture of 40–45° C. After heating the mixture at 55–60° C. for three hours, it is cooled, diluted with one liter of methylene chloride, and slowly poured into well-agitated isopropyl alcohol to precipitate the polymer. The polymer is washed in fresh isopropyl alcohol, dried, and reprecipitated from methylene chloride solution in methanol to give 100 g. of poly[4,4'-isopropylidenediphenyl 2-(1,2-diphenylcyclopropenyl-3- carbonyloxy)trimethylene ether]. The unsensitized polymer has a sensitivity value of 71, when sensitized with 2,6-bis(p-ethoxyphenyl)-4-(p-amyloxyphenyl)thiapyrylium perchlorate it has a sensitivity value of 450, and when sensitized with 2-benzoylmethylene-1-methyl-$\beta$-naphthothiazoline it has a sensitivity value of 1,800.

EXAMPLE 8

2.5 g. of Elvanol 52–22 is heated with 50 ml. of pyridine on a steam bath for 2 hours. Then 6 g. of benzoyl chloride is added in small portions with stirring. The mixture is allowed to stand for 15 minutes, then filtered through coarse filter paper to remove a small amount of undissolved polymer. The filtered solution is treated with an excess of 1,2-diphenylcyclopropene-3-carbonyl chloride and stirred for 30 minutes. The polymer is precipitated into methanol, stirred briefly and squeezed nearly dry. The polymer is dissolved in chloroform, again precipitated into methanol and squeezed dry. The polymer is dissolved in chloroform (5% by weight), whirl coated onto grained aluminum support and exposed to a dot pattern of light from a 500 watt slide projector. After 5 minutes' exposure, the element is washed with chloroform and then treated with a blue dye bath to give a good image.

EXAMPLE 9

To a solution of 50 g. of polystyrene in 500 ml. of chloroform at −10° C. there is added 7.5 ml. of stannic chloride in 100 g. of chloromethyl methyl ether and the mixture is maintained at 0 to −10° C. for one and one half hours. Then a mixture of dimethoxyethane and water is added until all color disappears. The polymer is precipitated into methanol, washed and squeezed dry, dissolved in chloroform, precipitated into methanol, chopped in a blender, washed with methanol, and dried in a vacuum oven at 100° C. for several hours. Then 11 grams of this chloromethylated polystyrene is dissolved in 300 ml. of ethylacetate to which is added 25 grams of 1,2-diphenylcyclopropene carboxylic acid and 10.7 g. of triethylamine as an acid acceptor. The mixture is refluxed for 48 hours, at which time a precipitate has formed. The solvent is decanted from the precipitate, chloroform is added and the polymer, in which the cyclopropenyl group is joined to the polymer backbone through a carbonyloxy group is precipitated by pouring the chloroform solution into methanol and dried. A portion of the polymer is disolved in chloroform with 1% Michler's ketone to make a 5% total solids solution. The solution is coated onto grained aluminum support, dried, exposed through a mask of 3660 A. A light and then developed in chloroform. An image is obtained in exposed areas of the coating and is made visible by dyeing with a bath containing a blue dye.

EXAMPLE 10

In a round bottom flask cooled with a mixture of acetone and Dry Ice, 140 g. of ethyl glycinate, 300 ml. of water and 150 ml. of chlorobenzene are combined and cooled to −5° C. Then 83 g. of sodium nitrite in 250 ml. of water is added and the mixture cooled to −10° C. Then 95 g. of 5% sulfuric acid is added with stirring and the bath temperature is adjusted to maintain the mixture below 0° C. The entire procedure is carried out under argon. When heat is no longer evolved the mixture is placed in an iced separatory funnel and the organic layer drawn off and added to a solution of 50 g. of sodium bicarbonate in 1 liter of water. After stirring with the bicarbonate solution for several minutes, the organic layer is separated and dried. The solution is then added dropwise over several hours to a mixture of 200 ml. of 4-octyne and 500 mg. of copper dust with stirring at 135° C., and the mixture is stirred an additional hour at 135° C. and then distilled under vacuum. The fraction boiling at 50–70° C. at about 0.1 mm. mercury pressure is hydrolyzed by refluxing with 500 ml. of methanol and 30 g. of potassium hydroxide for 30 minutes. The methanol is evaporated, the residue dissolved in water and extracted with chloroform. The water layer is acidified with hydrochloric acid and extracted with chloroform. The chloroform layer is dried with magnesium sulfate and then treated with 75 g. of oxalyl chloride. After gas evolution has ceased, the chloroform is evaporated and the residue distilled under vacuum. The resulting 1,2-di-n-propylcyclopropene-3-carbonyl chloride is added to a solution of 9.8 g. of Elvanol 52–22 which has been swollen in 175 ml. of pyridine for 2 hours on a steam bath and to which 7 ml. of benzoyl chloride has been added. After stirring for 30 minutes 10 ml. of benzoyl chloride is added and the mixture is stirred for 30 minutes. The polymer is precipitated into water, leached for 24 hours and dissolved in methylene chloride. The solution is dried with magnesium sulfate, filtered and precipitated into methanol. The polymer is washed with methanol, then dissolved in methylene chloride. A coating of the polymer on an aluminum support is exposed to ultraviolet light from a low pressure mercury arc lamp to give a good visible image after development with methylene chloride and dyeing.

EXAMPLE 11

To a solution of 10.0 g. of a cresol formaldehyde resin (Alnovol 429K sold by American Hoechst Corp.) in 100 cc. of dioxane is added 25.4 g. of 1,2-diphenylcyclopropenyl-3-carbonyl chloride in 100 cc. of dioxane. There is then added 11.2 g. of 1,4-diaza-bicyclo[2,2,2]octane, as an acid acceptor, and the mixture is stirred for 15 minutes. The suspended white solid which forms is dissolved by addition of 10 cc. of water and the solution is stirred for an additional 15 minutes. There is isolated 32 g. of product by precipitation in water, filtering, washing and drying at 40° C. for 16 hours. A coating of this polymer, sensitized with benzophenone, on a grained aluminum support is exposed through a negative to a source of ultraviolet light, and developed with dichloromethane to give an image in exposed areas of the element.

EXAMPLE 12

A 25% dioxane solution of poly(p-aminostyrene-co-styrene) (37:63) (5.0 g. polymer, 16.8 millimoles of $NH_2$) is added to a dioxane solution of 4.6 g. of 1,2-diphenylcyclopropenyl-3-carbonyl chloride. The mixture is stirred and 2.0 g. of 1,4-diaza-bicyclo[2,2,2]octane as an acid acceptor is added. To dissolve the insoluble hydrochloride which forms, 10 cc. of water is added. Stirring is continued for 30 minutes after which time 8.4 g. of polymer, in which the cyclopropenyl group is attached to the polymer backbone through an amido group, is isolated by precipitation into water, filtration, washing and drying at 40° C. for 16 hours. The polymer is sensitized with benzophenone, coated on a grained aluminum support, exposed to a source of ultraviolet light through a mask and developed with dichloromethane to give a polymer image.

Similar results are obtained with a polymer prepared by substituting 1,2 - diphenylcyclopropenyl - 3 - methyl tosylate, prepared by the method of Breslow et al., J. Am. Chem. Soc., Vol. 84 (1962), page 2798, for the 1,2-diphenylcyclopropenyl-3-carboxyl chloride employed in this example to obtain a polymer in which the cyclopropenyl group is attached to the polymer backbone through an amino group.

EXAMPLE 13

A solution of 0.3 g. of 1,2-diphenylcyclopropenyl-3-carbinol prepared by the method of Breslow et al., J. Am. Chem. Soc. Vol. 84 (1962), p. 2798, in 5 ml. of dimethylformamide is added to 0.4 g. of chloromethylated polystyrene, prepared as in Example 9, in 5 ml. of dimethylformamide. To this solution is added 0.2 g. of potassium t-butoxide in 5 ml. of dimethylformamide. The mixture is heated to 75° C. in an oil bath for 1 minute, then allowed to cool at room temperature for 20 minutes. The resulting polymer, in which the cyclopropenyl group is attached to the polymer backbone through an ether group, is twice precipitated into methanol, washed by decantation and collected. The polymer is dissolved in cyclohexanone with 1 mg. of thioxanthone as sensitizer, and coated on a grained anodized aluminum support. The coated support is imagewise exposed to an ultraviolet light source for 5 seconds. The coated support is then soaked in chloroform to dissolve unexposed polymer and develop a good image.

Similar results are obtained with a polymer prepared by substituting 1,2 - diphenylcyclopropenyl - 3-methyl mercaptan (prepared from 1,2-diphenylcyclopropenyl-3-methyl tosylate and potassium thioacetate followed by deacetylation with alcoholic ammonia) for the 1,2-diphenylcyclopropenyl-3-carbinol, to obtain a polymer in which the cyclopropenyl group is attached to the polymer backbone through a thioether group.

EXAMPLE 14

A solution of 0.3 g. of 1,2-diphenylcyclopropenyl-3-carbinol in 5 ml. of ether is added to 20 ml. of ether saturated with phosgene. Then 1 ml. of triethylamine in 20 ml. of ether is added to the mixture. The mixture is filtered to remove triethylamine hydrochloride and the filtrate evaporated under vacuum to give 1,2-diphenylcyclopropenyl-3-carbinol chloroformate as a white oil. To this oil is added a solution of 0.5 g. of the polyether employed in Example 7 dissolved in 10 ml. of pyridine. After 5 minutes the resulting polymer, in which the linking group is a carbonate group, is precipitated into methanol, washed twice with methanol by decantation, collected and pressed dry. The polymer is dissolved in chloroform with 1 mg. of thioxanthone as sensitizer and coated on a grained anodized aluminum support. The coated support is imagewise exposed to an ultraviolet light source for 5 minutes. A good image is developed by soaking the coated aluminum support in chloroform.

Similar results are obtained by replacing the 1,2-diphenylcyclopropenyl-3-carbinol with 3′-isocyanophenyl-1,2-diphenylcyclopropenyl-3-ketone, prepared by the method generally described in Example 1 of U.S. Pat. 2,728,-745, in pyridine solution to give a polymer in which the light sensitive moiety is attached to the polymer backbone through a urethane group.

EXAMPLE 15

Twenty-five grams of polyethylene are reacted with 15 g. sulfuryl chloride and 15 ml. chlorine to give poly-(ethylene-vinyl chloride-vinyl sulfonyl chloride). One gram of this polymer is dissolved in 10 ml. of benzene and 0.5 g. of 1,2-diphenylcyclopropenyl-3-carbinol in 1 ml. of pyridine is added. The solution is refluxed for 3 minutes, cooled and then the polymer is precipitated into methanol, washed and collected. The polymer is dissolved in a 50:50 mixture of benzene and chloroform and coated on a grained, anodized aluminum support. The coated support is imagewise exposed to an ultraviolet light source for 20 minutes. The coated support is then soaked in benzene to develop a good image.

Similar results are obtained with a polymer prepared by condensing the 1,2-diphenylcyclopropenyl-3-carbinol with a preformed high molecular weight copolymer of styrene and maleic anhydride in which the mole ratio of styrene units to maleic anhydride units is approximately 1:1.

EXAMPLE 16

100 g. of benzofuran carboxylic acid is refluxed with thionyl chloride in benzene to obtain the acid chloride, which is purified by distillation under vacuum followed by recrystallization from hexane. A photosensitive polymer is prepared by swelling 25 g. of Elvanol 52–22 overnight at 50° C. in 300 ml. of pyridine. Then 6.5 ml. of benzoyl chloride is added and the mixture is stirred for 10 minutes. Then 40 g. of benzofuran carboxylic acid chloride is added and the mixture is stirred for 10 minutes. Then 20 ml. of benzoyl chloride is added and the mixture is stirred for 30 minutes. The polymer is then precipitated into water with stirring, leached in water for 2 hours, filtered and dried in a vacuum oven. The polymer is dissolved in acetone, precipitated into water, leached, collected and dried. A coating of the polymer on grained aluminum is sensitive to light, becoming insoluble on exposure to tungsten light and has the following photosensitive characteristics:

| Sensitizer | Sensitivity value | Range of Spectral response |
|---|---|---|
| None | | 260–325 |
| 1 | 5.6 | 260–335 |
| 3 | 28 | 260–405 |
| 4 | 7.9 | 260–330 |

EXAMPLE 17

1,2-benzopyran-3-carboxylic acid chloride is prepared by refluxing the acid with thionyl chloride, and is purified by vacuum distillation. A photosensitive polymer is made from 12.5 g. of Elvanol 52–22 swollen at 50° C. in 200 ml. of pyridine, reacted with 3.3 ml. of benzoyl chloride, 21.5 g. of 1,2-benzopyran-3-carbonyl chloride, and 10 ml. of benzoyl chloride, with 10 minutes of stirring between the addition of each successive reagent. The polymer is precipitated into water, leached for several hours, collected and dried. The polymer is purified by dissolving in acetone, reprecipitating into water, collecting and drying. Coatings of the polymer on grained aluminum are sensitive to light and have the following photosensitive characteristics:

| Sensitizer | Sensitivity value | Range of Spectral response |
|---|---|---|
| None | 220 | 270–400 |
| 1 | 2,800 | 260–450 |
| 3 | 2,000 | 260–420 |
| 6 | 220 | 300–530 |

EXAMPLE 18

5,6-benzopyran-3-carboxaldehyde is prepared by dissolving five milliliters of salicylaldehyde in methanol and adding 0.8 equivalent of sodium hydroxide in water. Then, 3 ml. of acrolein is added and the mixture is stirred for 2 hours, diluted with water, and extracted with ether. The ether layer is evaporated, the residue is distilled under vacuum to give 5,6-benzopyran-3-carboxaldehyde as a yellow oil which solidifies upon standing. When this product is condensed with poly(ethyl-2-vinylcarbonyl acetate) in the presence of a base catalyst, a light sensitive polymer is obtained in which the light sensitive moiety is attached to the polymer backbone through a carbon to carbon double bond.

The invention has been described in detail with particular reference to preferred embodiments thereof, but it will be understood that variations and modifications can be effected within the spirit and scope of the invention.

What is claimed is:

1. A photosensitive element which comprises a support on which is coated a layer of a light-sensitive polymer having attached to the polymer backbone through a linking group a light-sensitive cyclopropenyl group having 1 and 2 ring position substituents selected from the group consisting of alkyl and aryl substituents.

2. A photosensitive element which comprises a support on which is coated a layer of a light-sensitive polymer having repeating units

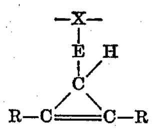

wherein X is a polymer backbone forming group; E is a linking group chosen from the class consisting of oxycarbonyl, carbonyloxy, thiocarbonyl, carbonylthio, amido, carbonate, sulfonate, and thiosulfonate groups; and each R is independently selected from the group consisting of aryl and alkyl substituents.

3. A photosensitive element which comprises a support bearing a layer of a light sensitive polymer containing repeating units having the structural formula

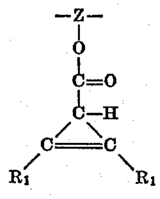

wherein Z is the polymeric residue of a hydroxyl-containing polymer and each $R_1$ is an aryl group.

4. A photosensitive element which comprises a support bearing a layer of the light sensitive condensation product of a derivative of a cyclopropenyl group with a preformed polymer backbone containing groups which are reactive with a group contained on the derivative of the unsaturated cyclic group, wherein the derivative of the unsaturated cyclic group is selected from the group consisting of carboxylic acid derivatives, carboxylic acid halide derivatives, alcohol derivatives, thioalcohol derivatives, alkyl halide derivatives and isocyanate derivatives, and the group on the polymer backbone reactive therewith is selected from the group consisting of free hydroxyl groups, free thiol groups, reactive amino groups, carboxylic acid anhydride groups, halogen groups and sulfonyl chloride groups.

5. A process for the preparation of photomechanical images which comprises the steps of (a) exposing to actinic radiation a photosensitive element comprising a support bearing a layer of a light sensitive polymer having repeating units

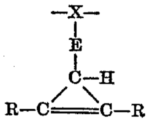

wherein X is a polymer backbone forming group; E is a linking group chosen from the class consisting of oxycarbonyl, carbonyloxy, thiocarbonyl, carbonylthio, amido, carbonate, sulfonate, and thiosulfonate groups; and each R is independently selected from the group consisting of aryl and alkyl substituents, to insolubilize the polymer in exposed areas, and (b) developing an image by removing the polymer from unexposed, non-insolubilized areas of the element with a solvent therefor which is a non-solvent for the polymer in exposed areas.

6. A process as defined in claim 5 wherein the light sensitive polymer contains repeating units having the structural formula:

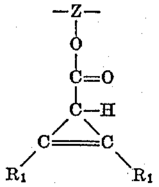

wherein Z is the polymeric residue of a hydroxyl-containing polymer and each $R_1$ is an aryl group.

7. A photosensitive composition which comprises a solution in an organic solvent of a light-sensitive polymer having attached to the polymer backbone a light-sensitive cyclopropenyl group having 1 and 2 ring position substituents selected from the group consisting of alkyl and aryl substituents.

8. A photosensitive composition which comprises a solution in an organic solvent of a light-sensitive polymer having repeating units

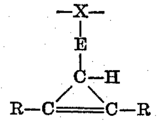

wherein X is a polymer backbone forming group; E is a linking group chosen from this class consisting of oxycarbonyl, carbonyloxy, thiocarbonyl, carbonylthio, amido, carbonate, sulfonate and thiosulfonate groups; and each R is independently selected from the group consisting of aryl and alkyl substituents.

9. A photosensitive composition as defined in claim 8 wherein the light sensitive polymer contains repeating units having the structural formula

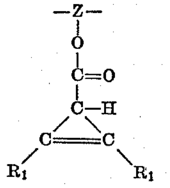

wherein Z is the polymeric residue of a polymer containing free hydroxyl groups and each $R_1$ is an aryl group.

10. A photosensitive composition as defined in claim 9 further comprising a film-forming resin.

11. A photosensitive composition as defined in claim 9 further comprising a sensitizer.

12. A photosensitive composition according to claim 11 in which said sensitizer is chosen from the class consisting of 2-benzoylmethylene-1-methyl-beta-naphthothiazoline, Michler's ketone, 9-fluorenone, benzil, 4-methylbenzophenone and N-phenyl-acridone.

References Cited

UNITED STATES PATENTS

| | | | |
|---|---|---|---|
| 3,453,110 | 7/1969 | Delzenne et al. | 96—115 R |
| 3,497,352 | 2/1970 | Delzenne et al. | 96—35.1 |
| 3,579,343 | 5/1971 | Kogure et al. | 96—90 R |

RONALD H. SMITH, Primary Examiner

U.S. Cl. X.R.

96—33, 115 R; 204—159.14; 260—91.3